United States Patent
Siew et al.

(10) Patent No.: US 8,577,190 B2
(45) Date of Patent: Nov. 5, 2013

(54) OPTOCOUPLER

(75) Inventors: Gary Tay Thiam Siew, Singapore (SG); Gopinath Maasi, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/314,023

(22) Filed: Dec. 7, 2011

(65) Prior Publication Data

US 2012/0076455 A1 Mar. 29, 2012

Related U.S. Application Data

(63) Continuation-in-part of application No. 12/945,474, filed on Nov. 12, 2010, which is a continuation-in-part of application No. 12/729,943, filed on Mar. 23, 2010, now Pat. No. 8,412,006.

(51) Int. Cl.
  *G02B 6/12* (2006.01)
(52) U.S. Cl.
  USPC .............................................. 385/14; 385/94
(58) Field of Classification Search
  USPC .......................................... 385/14, 39, 88–94
  See application file for complete search history.

(56) References Cited

U.S. PATENT DOCUMENTS

| | | | |
|---|---|---|---|
| 4,114,177 A | 9/1978 | King | |
| 4,179,619 A | 12/1979 | Cook | |
| 4,450,461 A * | 5/1984 | Cook et al. | 257/82 |
| 5,150,438 A * | 9/1992 | Brown | 385/14 |
| 5,329,131 A * | 7/1994 | Wijdenes et al. | 250/551 |
| 5,340,993 A * | 8/1994 | Salina et al. | 250/551 |
| 5,500,912 A * | 3/1996 | Alonas et al. | 385/37 |
| 5,614,131 A * | 3/1997 | Mukerji et al. | 264/1.9 |
| 5,751,009 A | 5/1998 | Anderson et al. | |
| 5,753,929 A | 5/1998 | Bliss | |
| 6,246,123 B1 | 6/2001 | Landers et al. | |
| 6,556,750 B2 | 4/2003 | Constantino et al. | |
| 6,756,689 B2 | 6/2004 | Nam et al. | |
| 6,864,509 B2 | 3/2005 | Worley | |
| 7,021,839 B2 * | 4/2006 | Ho | 385/92 |
| 7,112,457 B2 | 9/2006 | Kek et al. | |
| 7,476,890 B2 | 1/2009 | Kishi | |
| 7,589,338 B2 | 9/2009 | Liu et al. | |
| 7,748,912 B2 | 7/2010 | Ho et al. | |
| 7,868,465 B2 | 1/2011 | Otremba et al. | |
| 7,956,338 B2 | 6/2011 | Keita et al. | |

(Continued)

FOREIGN PATENT DOCUMENTS

EP 0103032 3/1984

OTHER PUBLICATIONS

Kek, Theng-Hui, et al., "Stacked LED Makes Compact Optocouplers," Semiconductor Products Group Isolation Products Division Agilent Technologies Inc., Apr. 1, 2005.

(Continued)

*Primary Examiner* — Daniel Petkovsek

(57) ABSTRACT

An optocoupler having an optical transmitter die, an optical receiver die, a light guide, a limiting element and a body is disclosed. The light guide is confined to upper portion of the body by using the limiting element. In one embodiment, the limiting element is a dielectric tape. In yet another embodiment, the limiting element is a pre-molded plastic attached to the lead frame via non-conductive epoxy. The use of the limiting element yields light guides having consistent shape.

20 Claims, 11 Drawing Sheets

(56) References Cited

U.S. PATENT DOCUMENTS

| | | |
|---|---|---|
| 8,106,406 B2 | 1/2012 | Liu et al. |
| 8,346,033 B2 | 1/2013 | Kubota |
| 2007/0045882 A1 | 3/2007 | Ho |
| 2009/0174048 A1 | 7/2009 | Liu et al. |
| 2011/0235974 A1 | 9/2011 | Tay et al. |

OTHER PUBLICATIONS

"Optocoupler Solutions", Lit No. 250001-006 (2010), *Fairchild Semiconductor*, www.fairchildsemi.com 2010.

Basso, Christophe, "Dealing With Low-Current Optocouplers", Sep. 1, 2009, powerelectronics.com Sep. 1, 2009.

* cited by examiner

US 8,577,190 B2

OPTOCOUPLER

This is a continuation-in-part of U.S. application Ser. No. 12/945,474, filed on Nov. 12, 2010. The U.S. application Ser. No. 12/945,474 is in turn, a continuation-in-part of U.S. application Ser. No. 12/729,943 filed on Mar. 23, 2010, now U.S. Pat. No. 8,412,006, all of which are incorporated by reference herein.

BACKGROUND

A galvanic isolator provides a mean for moving a signal from one electrical circuit to another electrical circuit when the two electrical circuits must otherwise be electrically isolated from one another. Usually the two electrical circuits operate at different voltages, and thus, must be electrically isolated. For example, consider an application in which a 5V battery powered controller board is utilized to control a motor circuit operating at 240V. In this example, it is essential to electrically isolate the 240V motor circuits from the 5V controller circuit, while permitting the 5V controller circuit to send or receive signals from the 240V motor circuit. In this type of application, a galvanic isolator may be used to provide voltage and noise isolation, while permitting the information exchange between the two circuit systems. For electrical system with more than two circuits operating at different voltages, a multichannel galvanic isolator may be used.

There are three main types of galvanic isolators. The first type is a wireless radio frequency transceiver, in which a signal is sent from one circuit to another circuit via a wireless signal. The second type is a magnetic isolator in which the signal is transmitted from one circuit to another circuit by means of a magnetic field. The third type is an optocoupler in which the signal is transferred between circuits by means of light waves. Galvanic isolators may be used in applications involving voltage operating in kilovolts. Magnetic isolators and radio frequency isolators may have limitation in shielding noise from one circuit system to another circuit system because the entire circuit in the isolators may be susceptible to the strong magnetic field or the radio frequency waves that may induce voltage or current. However, optocouplers, couplings signals by means of light waves, do not induce noise in the same way that magnetic isolators or radio-frequency transceivers induce noise.

Generally, an optocoupler comprises an optical transmitter die and an optical receiver die. The optical transmitter die and the optical receiver die may be housed in a single package. A multichannel optocoupler may have more than one pair of optical transmitter or receiver dies. A signal is usually transmitted from the optical transmitter die to the optical receiver die. In order to prevent light loss, a light guide is typically employed. In most cases, the light guide is formed by dispensing a transparent encapsulant in liquid form over the optical transmitter and receiver dies. The transparent encapsulant is then hardened through a curing process into a light guide. The shape of the light guide may be dependent on the viscosity of the encapsulant, and therefore, the shape of the light guide may be difficult to control. This issue of controlling the light guide shape may be more severe for an optocoupler with large dies or for a multichannel optocoupler.

BRIEF DESCRIPTION OF THE DRAWINGS

Illustrative embodiments by way of examples, not by way of limitation, are illustrated in the drawings. Throughout the description and drawings, similar reference numbers may be used to identify similar elements.

DETAILED DESCRIPTION

Figure 1:
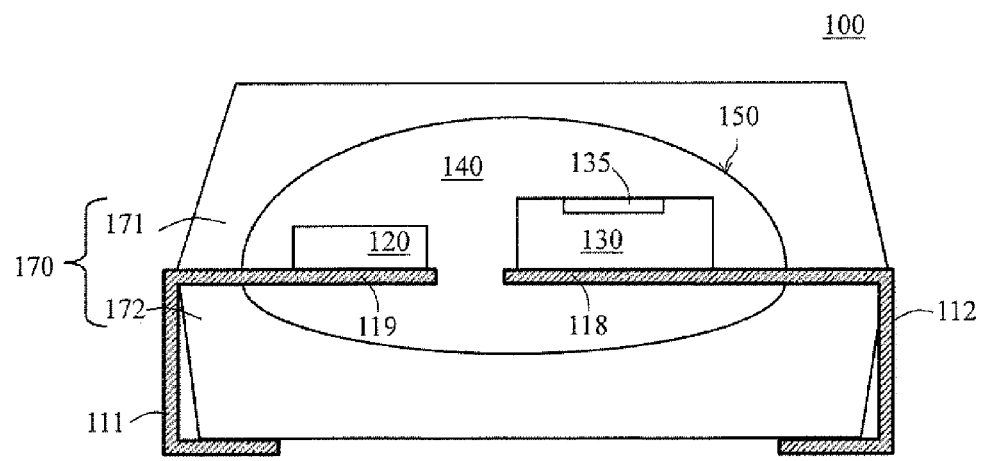
FIG. 1 illustrates a cross-sectional view of an optocoupler in a lead frame package.

FIG. 1 illustrates a cross-sectional view of an optocoupler 100 in a lead frame package. The optocoupler 100 comprises a plurality of conductors 111-112, an optical transmitter die 120 and an optical receiver die 130. The plurality of conductors 111-112 are made from conductive material and may be formed from a lead frame. The plurality of conductors 111-112 may be known as leads or conductive traces. The conductors 111-112 may be extended to form conductive pads 118-119, such that the conductive pad 118-119 may be configured to hold the optical transmitter 120 and receiver 130 dies. The plurality of conductors 111-112 may be configured as a mean to connect the dies 120 and 130 to external circuitry (not shown). For example, the plurality of conductors 111-112 may be extended to the edge or the bottom of the optocoupler 100, in order to serve as electrical contacts to external circuitry (not shown).

The optical transmitter die 120 may be a light emitting diode (referred hereinafter as LED) or any light source capable of emitting light. The optical transmitter die 120 may be an integrated circuit with an embedded LED and driver circuit. Depending on the design requirements, control circuitry may be integrated into the optical transmitter die 120. The optical transmitter die 120 may be configured to be powered by a first power supply (not shown) by means of the conductor 111. The optical transmitter die 120 may be operable to emit light in accordance with a logic signal from an external circuit (not shown) operating on the first power supply (not shown). For example, a logic signal "HIGH" may be transmitted to the optical transmitter die 120 through conductor 111. The optical transmitter die 120 would, in response, emit light output indicating the "HIGH" signal.

The optical receiver die 130 may comprise a photo-detector 135, such as a photo-diode or a photo-transistor. The optical receiver die 130 may be an integrated circuit with an embedded photo-detector 135, or alternatively, an amplifier circuit (not shown) to amplify photocurrent generated by the photo-detector 135. Depending on the design requirements, control circuitry may be integrated into the optical receiver die 130 to provide signal processing. The optical receiver die 130 may be configured to be powered by a second power supply (not shown) through the conductor 122. The optical receiver die 130 may be operable to receive a signal in the form of light emitted from the optical transmitter die 120.

The optical transmitter 120 and receiver 130 dies may be encapsulated by a transparent encapsulant, such as clear epoxy, silicon or other similar materials to form a light guide 140. The transparent encapsulant is then encapsulated by an opaque encapsulant to form a body 170 comprising an upper portion 171 and a lower portion 172. The upper 171 and lower 172 portions may be made using two different tools in a molding process. The opaque encapsulant may be plastic, ceramic, or any other substantially opaque or black compound used to form the body 170 of a packaging. Optionally the transparent encapsulant may be enveloped by a reflective material 150, capable of reflecting light before being encapsulated in the opaque encapsulant, such as a white epoxy, a metallic material, or other similar reflective material.

The transparent encapsulant forms the light guide 140 for transmitting the light emitted from the optical transmitter die 120 to the optical receiver die 130. The transparent encapsulant may be formed by dispensing an encapsulant in liquid form to encapsulate both the optical transmitter 120 and receiver 130 dies. The liquid transparent encapsulant is then cured into a solid, forming the light guide 140. The size of the light guide 140 is controlled by controlling the amount of the liquid encapsulant dispensed, and may depend a great deal on the viscosity of the liquid encapsulant. For a small light guide 140, relying on the viscosity and the amount of the transparent epoxy dispensed may be sufficient to accomplish a substantially consistent size and shape without too much process variation. However, for larger dies 120-130 or for a multi-channel optocoupler, the process variation in terms of size and shape of the light guide 140 may be significant, resulting in inconsistently sized and shaped light guides.

Figure 2:
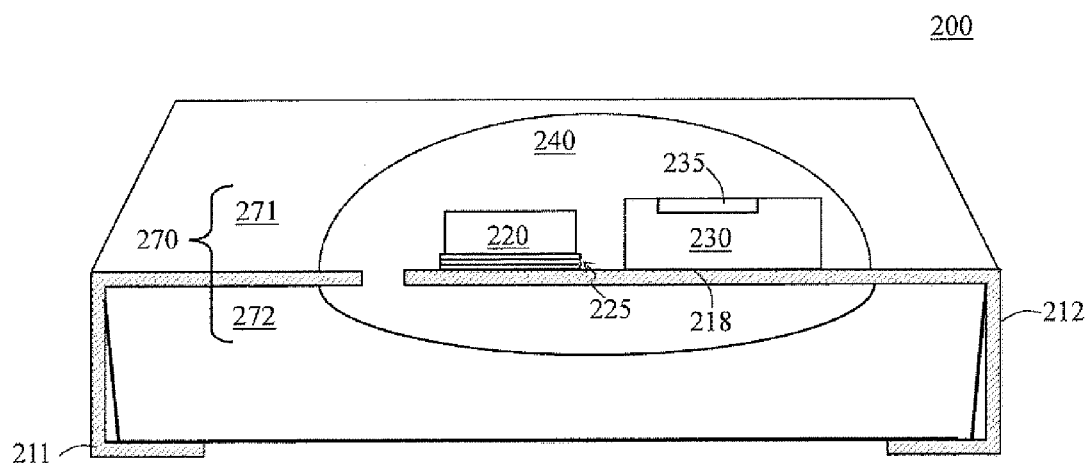
FIG. 2 illustrates a cross-sectional view of an optocoupler in a lead frame package having an optical transmitter die and a receiver die attached to a common conductive pad.

One way to obtain a more consistent light guide 140 is by making the distance of the optical transmitter 120 and receiver 130 dies closer to each other so that the light guide 140 is small. This may be accomplished by attaching the dies 120-130 on a common conductive pad 118-119 as shown in FIG. 2. However, as the optical transmitter 120 and receiver 130 dies may be connected to two different power supplies, it is essential to ensure proper electrical and noise isolation between the two dies 120-130.

FIG. 2 illustrates a cross-sectional view of an optocoupler 200 in a lead frame type packaging. The optocoupler 200 comprises a plurality of conductors 211-212, an optical transmitter die 220, an optical receiver die 230, a light guide 240 formed by a transparent encapsulant, and a body 270 having an upper portion 271 and a lower portion 272. The optical receiver die 230 further comprises a photo-detector 235. As shown in the embodiment of FIG. 2, one of the conductors 211-212 is extended to form a conductive pad 218. The optical transmitter 220 and receiver 230 dies are attached to the common conductive pad 218. The optocoupler 200 in FIG. 2 is substantially similar to the optocoupler 100 in FIG. 1 but differs at least in that both the optical transmitter 220 and receiver 230 dies are attached to the common conductive pad 218. In the embodiment shown in FIG. 2, the optical transmitter die 220 may be electrically connected to the conductor 211 but the optical receiver die 230 may be connected to the conductor 212.

As shown in the embodiment of FIG. 2, the optical transmitter die 220 is attached to the conductive pad 218 via three layers of materials 225, comprising an isolation layer sandwiched between two securing layers. The isolation layer provides electrical isolation for the optical transmitter die 220 from the conductive pad 218, which is electrically connected to the optical receiver die 230. The isolation layer may be a layer of glass, a polyimide, or similar electrically insulating materials. The isolation layer may or may not have sufficient adhesive properties to hold the optical transmitter die 220 onto the conductive pad 218.

The securing layers may be a layer of silicon dioxide, silicon, nitride, benzo cyclo butane (BCB) or any other suitable insulating adhesive material. The securing layers may be an epoxy material suitable for die attachment use. Such an epoxy includes, but is not limited to, those epoxies sold by Tra-con of Massachusetts, USA. The securing layers have sufficient adhesive properties to hold the optical transmitter die 220 and the isolation layer onto the conductive pad 218. The three layers of materials 225 may be electrically insulating, and thus capable of providing the optical transmitter die 220 voltage and noise isolation from the conductive pad 218, which is electrically connected to the optical receiver die 230.

The securing layers may be in liquid form at the beginning of manufacturing process, but may be hardened later in the of manufacturing process, for example through exposure to heat or UV light to form a solid layer. The isolation layers may prevent the optical transmitter die 220 from physically touching the conductive pad 218 at the beginning of manufacturing process when the securing layers may be in liquid form.

In the embodiment shown in FIG. 2, the optical transmitter die 220 is attached to the conductive pad 218 through the three layers of materials 225, while the optical receiver die 230 is attached directly to the conductive pad 218. This design may also be reversed. The choice may be based on various design considerations, such as relative height profiles, thermal conductance requirements, power and ground requirements of each die 220-230, and the like.

Figure 3:
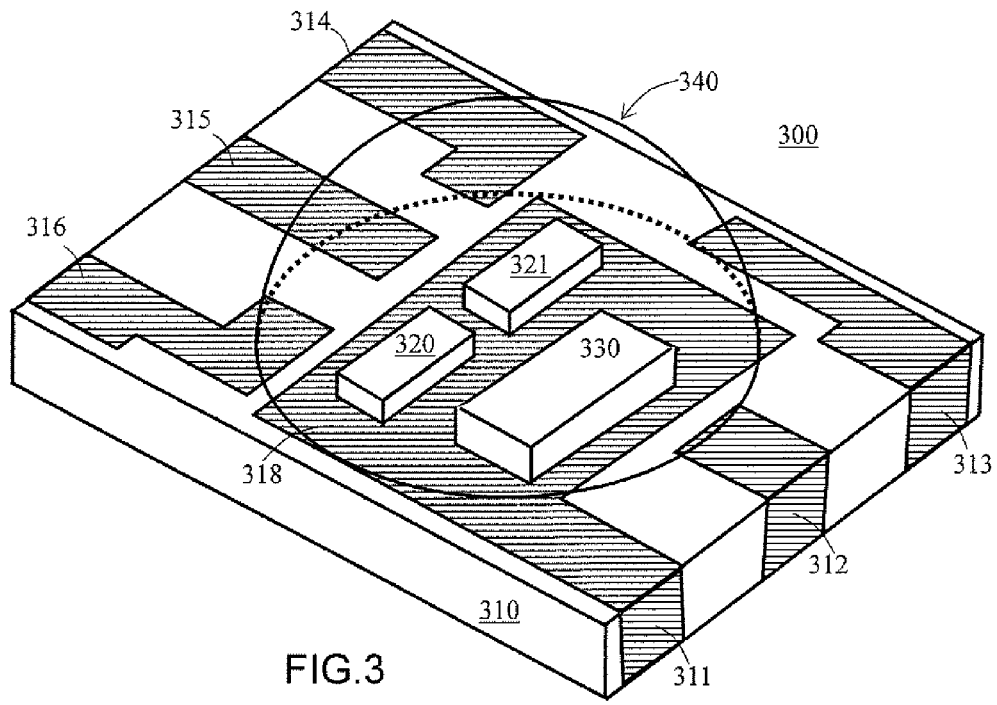
FIG. 3 illustrates an embodiment of a partially completed multichannel optocoupler having two optical transmitters and one optical receiver on a printed circuit board encapsulated by a transparent encapsulant, without wire bonds and without an encapsulant.

Optocouplers with more than one pair of transmitter 220 and receiver 230 dies are known as multichannel optocouplers. FIG. 3 shows a partially completed multichannel optocoupler 300 without wire bonds or an opaque encapsulant. The multichannel optocoupler 300 comprises a substrate 310, two optical transmitter dies 320-321 and an optical receiver die 330. The dies 320-321 and 330 are encapsulated by a transparent encapsulant forming a light guide 340. The substrate 310 may be a printed circuit board (referred hereinafter as PCB). The substrate 310 further comprises a plurality of conductors 311-316. In the case of a PCB, the conductors 311-316 may also be known as conductive traces. One of the conductors 311-316 may be extended to form a conductive pad 318. The optical transmitter dies 320-321 and the optical receiver die 330 may be attached to the conductive pad 318. One of the dies 320-321 and 330 may be attached directly to the conductive pad 318, while the other dies 320-321 and 330 may be attached to the conductive pad 318 by means of the three layers of insulating materials 225, shown in FIG. 2.

Although having multiple dies 320,321 and 330 attached to the same conductive pad 318 may reduce the size of the light guide 340, making the light guide 340 in a consistent size may still be challenging, as the number of dies 320-321 and 330 increases. In order to encapsulate all of the dies 320-321 and 330, the size of light guide 340 unavoidably will increase. One effective way to make the light guide 340 with a consistent size and shape is to use light guide defining elements 460, as shown in the embodiment in FIG. 4.

Figure 4:
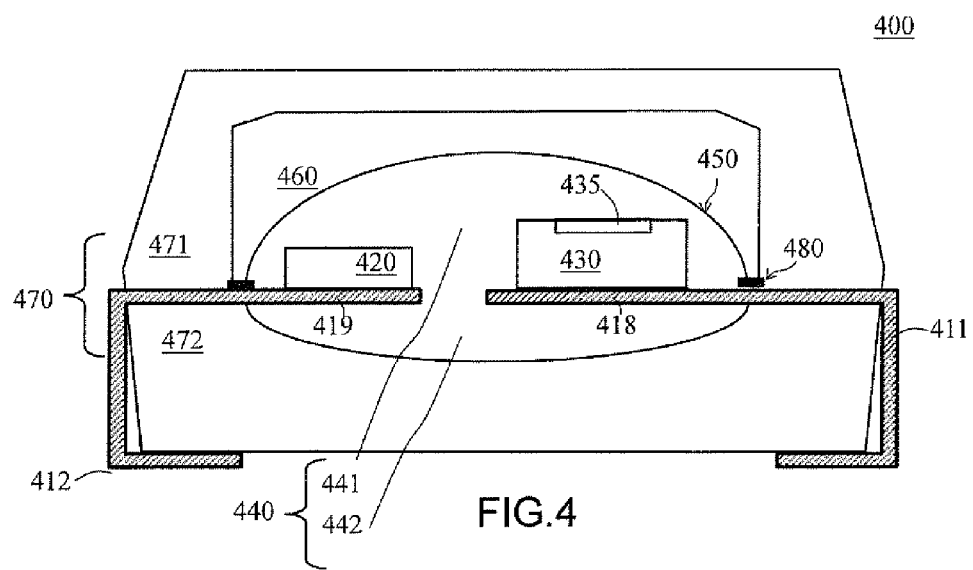
FIG. 4 illustrates a cross-sectional view of an optocoupler with light guide defining element in a lead frame package.

The optocoupler 400 in FIG. 4 comprises a plurality of conductors 411-412 that may be leads of a lead frame, an optical transmitter die 420, an optical receiver die 430 that may have a photo-detector 435, a light guide 440 formed by a transparent encapsulant encapsulating the dies 420-430, a light guide defining element 460, and a body 470 formed by an opaque encapsulant comprising an upper portion 471 and a lower portion 472. The upper 471 and lower 472 portions of the body 470 may be formed using two different tools in a molding process. Similarly, the light guide 440 may be divided into an upper portion 441, and a lower portion 442. Some of the conductors 411-412 may be extended to form conductive pads 418-419 for receiving the dies 420-430. Similar to the optocouplers 100 and 200 shown in the embodiments of FIG. 1, and FIG. 2, respectively, the optical transmitter die 420 may be connected to a first power supply (not shown) while the optical receiver die 430 may be connected to a second power supply (not shown) isolated from the first power supply (not shown).

As shown in FIG. 4, the light guide defining element 460 may have a cavity with a reflective surface 450 defining the light guide 440 formed by the transparent encapsulant. The light guide defining element 460 may define any suitable shape. However, the cavity may define a suitable shape for the light guide 440, which is usually a substantially dome shape. The light guide defining element 460 may be formed of polycarbonate, high index plastic, acrylic plastic or any other similar materials. In order to better control the regulation of light by the reflective surface 450, optionally micro-optics can be formed at the reflective surface 450. The light guide defining element 460 may be attached to the plurality of conductors 411-412 through a non-conductive epoxy 480. Such non-conductive epoxy 480 may include, but are not limited to, those epoxies sold by Henkel Corporation, Sumitomo Metal Mining Co. Ltd., METAL MINING Co., Ltd, and Epoxy Technology Inc. Other attachment methods, such as a non-conductive adhesive die attach method or a heat staking method may also be employed to attach the light guide defining element 460 to the plurality of conductors 411-412.

One possible method to make the optocoupler 400 shown in the embodiment of FIG. 4, is by first attaching the dies 420-430 to one side of the conductive pads 418-419. The next step may be the wire bond process, in which the dies 420-430 may be bonded to their respective conductors 411-412 to establish electrical connection. It should be noted that there may be more conductors 411-412 than shown in the figures. After wire bonding, the light guide defining element 460 may be attached to conductors 411-412 via the non-conductive epoxy 480, such that the dies 420-430 are located in the vicinity of the cavity defined by the reflective surface 450. The transparent epoxy in liquid form is then injected into the cavity to form the light guide 440.

The upper portion 441 of the light guide 440 is bounded by the light guide defining element 460. In order to increase the reliability performance and to fully encapsulate the dies 420-430, the amount of transparent encapsulant injected may be more than the volume defined by the cavity of the light guide defining element 460. As shown in the embodiment of FIG. 4, the light guide 440 further comprises a lower portion 442 located outside the cavity of the light guide defining element 460. The shape and size of the lower portion 442 has less impact on the optical performance, as the lower portion 442 is located on the opposite side of the optical dies 420-430. The size and shape of the lower portion 442 may not be tightly controlled for cost considerations.

Next, the liquid transparent encapsulant may then be cured into solid form. The light guide defining element 460 and a portion of the conductors 411-412 may then be encapsulated by the opaque encapsulant forming the lower portion 472 of the body 470 through a first molding process. The lower portion 472 of the body 470 may be referred to as substrate. The lower portion 472 of the body 470 may then go through a second molding process to form the upper portion 471 of the body 470. Finally, the conductors 411-412 may be separated from the lead frame (not shown) and bent into the required shape.

As shown in the embodiment of FIG. 4, the shape of the upper portion 441 of the light guide 440 may be substantially a dome shape following the shape of the light guide defining element 460. Technically, the lower portion 442 of the light guide 440 may be made substantially flat or any other convenient, cost effective shape. However, in order to improve reliability performance and to prevent arching or delamination, the lower portion 442 may be made into a smaller, substantially domed shape, similar to the upper portion 421. Alternatively, a tape 590 (See FIG. 5) made from Mylar, Polyimide, Melinex, or any other similar material may be attached as or to the lower portion 442 of the light guide 440 to increase the reliability performance. This is shown in FIG. 5, in which tape 590 substantially replaces some or all of the lower portion 442.

Figure 5:
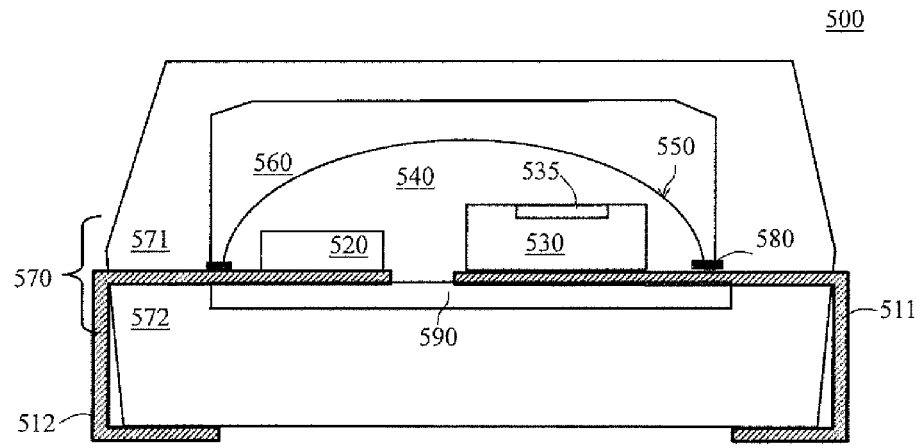
FIG. 5 illustrates a cross-sectional view of an optocoupler with light guide defining element and a tape in a lead frame package.

FIG. 5 shows an embodiment of an optocoupler 500 substantially similar to the optocoupler 400, but differs at least in that a tape 590 is employed to increase reliability performance. The optocoupler 500 comprises a plurality of conductors 511-512, an optical transmitter die 520, an optical receiver die 530 having at least one photo-detector 535, a light guide 540, a light guide defining element 560, and a body 570 having an upper 571 portion and a lower portion 572. The light guide defining element 560 is attached to the conductors 511-512 through a non-conductive epoxy 580. Optionally, the reflective surface 550 of the light guide defining element 560 may have micro optics configured to direct light emitted from the optical transmitter die 520 to the optical receiver die 630. Unlike the optocoupler 400 with a substantially large bottom portion 442, as shown in FIG. 4, the light guide 540 in the optocoupler 500 defines a semi-dome shape almost without the lower portion 442 shown in FIG. 4. In contrast, the tape 590 is used to strengthen the structure of the light guide 540. The tape 590 may be made adhesive and may be attached to the light guide 540 after the transparent encapsulant is cured. Another one of the advantages of using the tape 590 is that the tape 590 enables the lower portion 442 (See FIG. 4) to be substantially flat, in order to increase the efficiency of the light guide 540. As the tape 590 may be substantially flat on the lower portion 442, the height of the optocoupler 500 may also be decreased. In another embodiment, the optocoupler 500 shown in FIG. 5 may not include the light guide defining element 560. The shape of the light guide 540 depends on the viscosity of the encapsulant. However, the tape 590 may be able to reduce the process variations with respect to the shape and size of the light guide 540.

Figure 6:
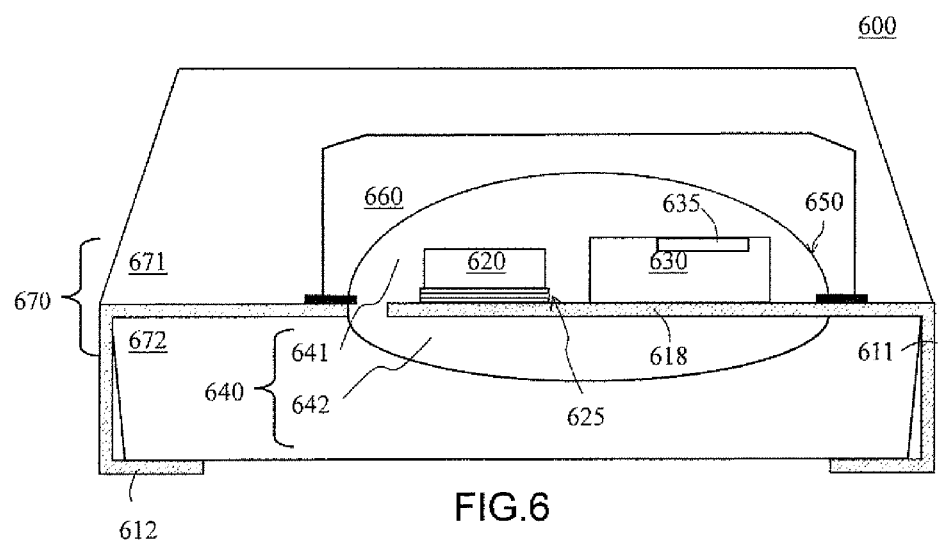
FIG. 6 illustrates a cross-sectional view of an optocoupler having an optical transmitter die and a receiver die attached to a common conductive pad with light guide defining element.

FIG. 6 shows another embodiment of an optocoupler 600, which is similar to the optocoupler 400, shown in FIG. 4. The optocoupler 600 may comprise a plurality of conductors 611-612 with one of the conductors 611-612 being extended to form a common conductive pad 618, an optical transmitter die 620, an optical receiver die 630 having at least one photo-detector 635, a light guide 640 formed by transparent encapsulant, a light guide defining element 660 and a body 670 having an upper portion 671 and a lower portion 672. Optionally, micro-optics may be located at the reflective surface 650 of the light guide defining element 660. The light guide 640 may comprise an upper portion 641 and a lower portion 642, similar to the optocoupler 400, shown in FIG. 4.

One difference between the optocoupler 600 and the optocoupler 400 shown in FIG. 4 is that both the optical transmitter 620 and receiver 630 dies are attached to the common conductive pad 618. The optical transmitter 620 may be attached to the common conductive pad 618 via three layers of materials 625, comprising an isolation layer sandwiched between two securing layers. Having the optical transmitter 620 and receiver 630 dies attached to the common pad 618 enables the light emitted by the optical transmitter die 620 to travel a shorter distance before reaching the optical receiver die 630. In addition, the light guide defining element 660 ensures that the light guide 640 will be formed of a consistent size and shape. Therefore, the efficiency of the light guide 640 shown in FIG. 6 may theoretically be greater than the embodiment shown in FIG. 4.

Figure 7:
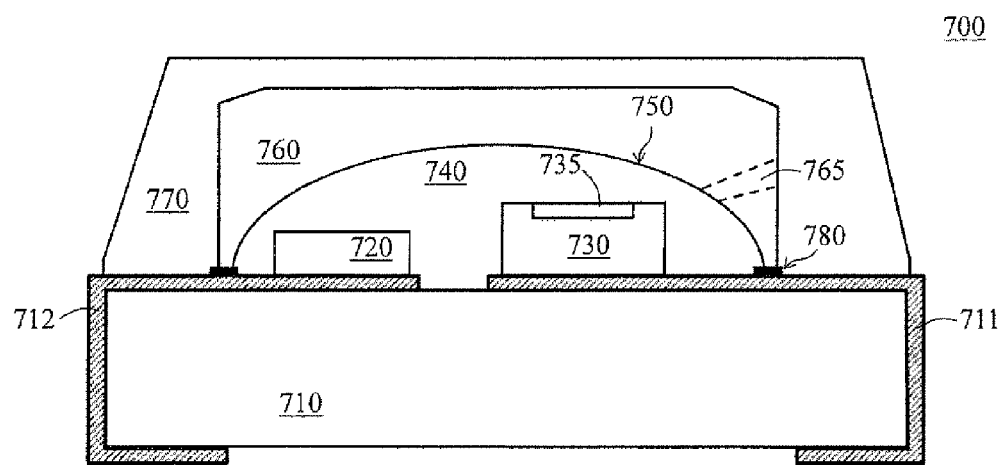
FIG. 7 illustrates a cross-sectional view of an optocoupler with light guide defining element attached to the printed circuit board.

FIG. 7 shows an embodiment of an optocoupler 700 using a PCB. The optocoupler 700 comprises a substrate 710, an optical transmitter 720 die, an optical receiver 730 die with at least one photo-detector 735, a light guide 740 having a reflective surface 750, a light guide defining element 760, and an opaque encapsulant 770. The substrate 710 may be a PCB having a plurality of conductors 711-712 located at both sides of the substrate 710. Unlike optocouplers 400, 500, and 600, the light guide defining element 760 in the optocoupler 700 may be attached anywhere on the substrate 710 by means of non conductive epoxy 780, rather than being limited to only attaching to the conductors 711-712. The light guide defining element 760 may have one or more optional apertures 765 for dispensing the liquid form transparent encapsulant into the cavity of the light guide defining element 760. Optionally, more apertures 761 may be formed at the light guide defining element 760 to function as air escape holes to prevent air from being trapped inside the cavity.

Figures 8A, 8B:
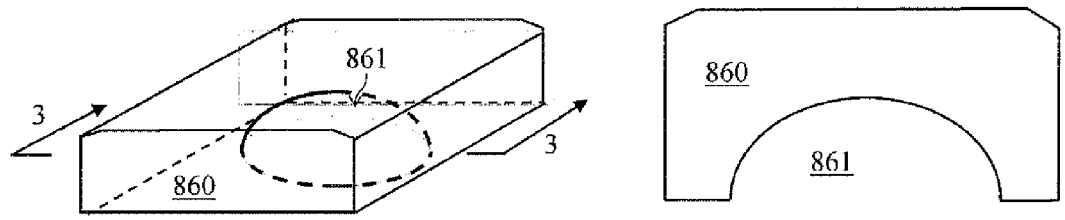
FIG. 8A illustrates a perspective view of a light guide defining element.
FIG. 8B illustrates a cross-sectional view of the light guide defining element along line 3-3.
Figure 8C:
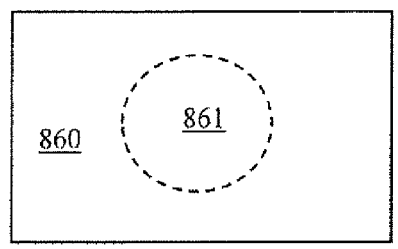
FIG. 8C illustrates a top view of the light guide defining element.

FIGS. 8A-8C show various views of the light guide defining element 860. FIG. 8A shows a perspective view of the light guide defining element 860. FIG. 8B shows a cross-sectional view of the light guide defining element 860 taken along line 3-3 shown in FIG. 8A. FIG. 8C shows a top view of the light guide defining element 860. The light guide defining element 860 may define a substantially rectangular shape having a cavity 861 of a substantially dome shape. The light guide defining element 860 may define any shape suitable to be attached to conductors 411-412 (See FIG. 4) or substrate 710 (See FIG. 7). The cavity 861 may define any shape suitable to reflect light from the optical transmitter die 720 toward the optical receiver die 730, shown in FIGS. 1-7. Optionally, the surface defining the cavity 861 may comprise a reflective material, a semi-reflective material, or micro-optics to control the distribution of light. Typically, there may be one cavity 861 in the light guide defining element 860. However, for multichannel optocouplers, there may be more than one cavity 861, as shown in FIG. 9.

Figure 9:
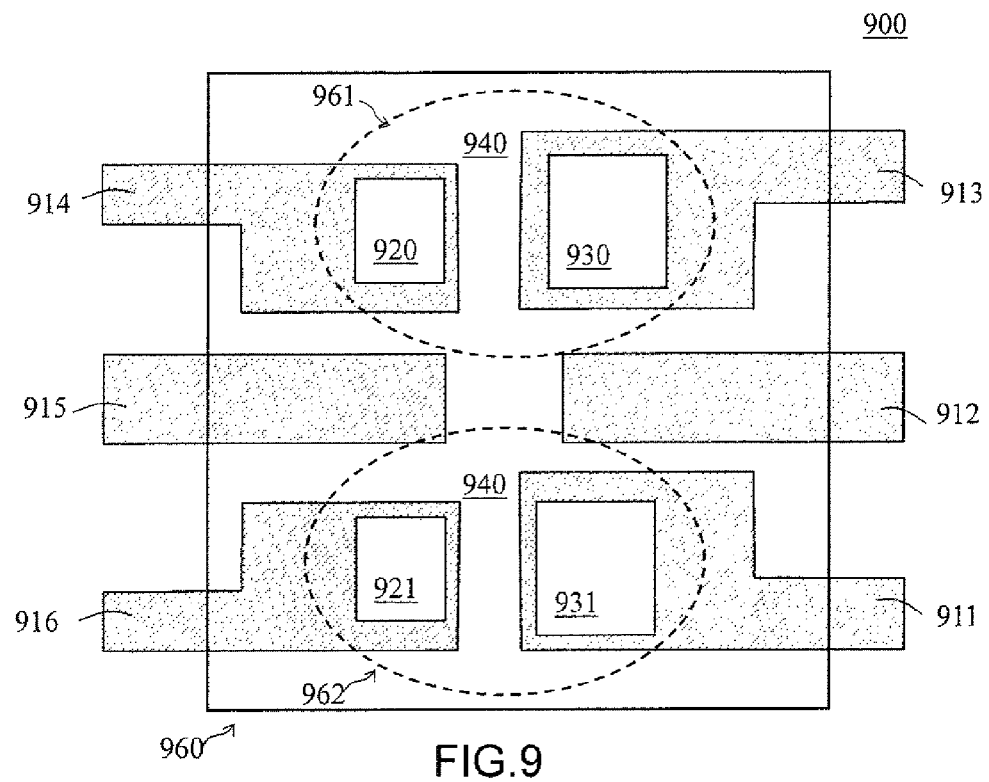
FIG. 9 illustrates a top view of a multichannel optocoupler with a light guide element having two cavities.

FIG. 9 is an embodiment showing a top view of a multi-channel optocoupler 900 without wire bond and without the opaque encapsulant. The optocoupler 900 comprises a plurality of conductors 911-916, a plurality of optical transmitter dies 920-921, a plurality of optical receiver dies 930-931, and a light guide defining element 960. The light guide defining element 960 comprises a plurality of cavities 961-962, each defining a light guide 940, each coupling an optical transmitter 920-921 die and an optical receiver 930-931 die. A first pair of optical transmitter 920 and receiver 930 dies may be located within or in the vicinity of the first cavity 961, whereas a second pair of optical transmitter 921 and receiver 931 dies may be located within or in the vicinity of the second cavity 962. With this arrangement, crosstalk between the first and second pairs of transmitter dies 920-921 and receiver dies 930-931 may be minimized.

Figure 10:
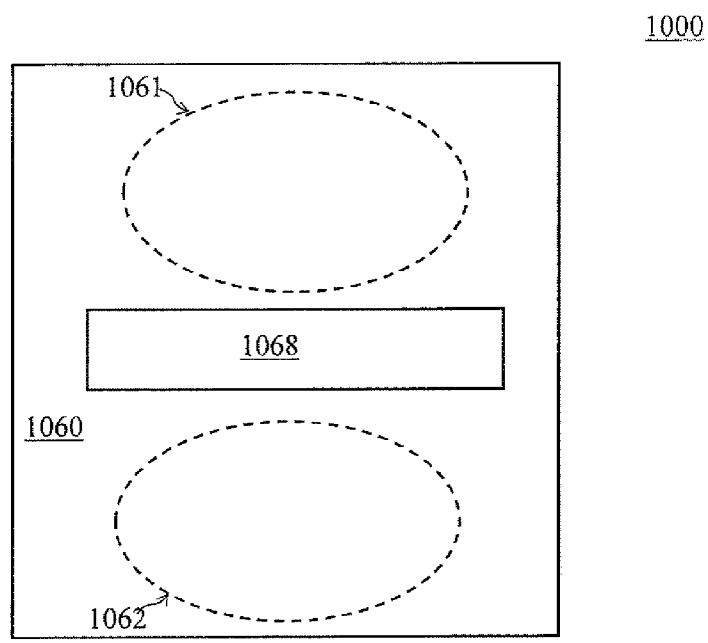
FIG. 10 illustrates a top view of a light guide defining element for a multichannel optocoupler with a light separation element.

In order to further optically isolate the two cavities 960-961, an optical separation element 1068, shown in FIG. 10, may be utilized. FIG. 10 illustrates a top view 1000 of a light guide defining element 1060 having a plurality of cavities 1061-1062. The optical separation element 1068 may be merely a void defined within the body of the light guide defining element 1060, so that light may be reflected through total internal reflection. Alternatively, the optical separation element 1068 may be formed by filling the void defined in the body of the light guide defining element 1060 with a substantially opaque encapsulant material, such as the material used to form the body 470 of the optocoupler 400, as shown in FIG. 4.

Figure 11:
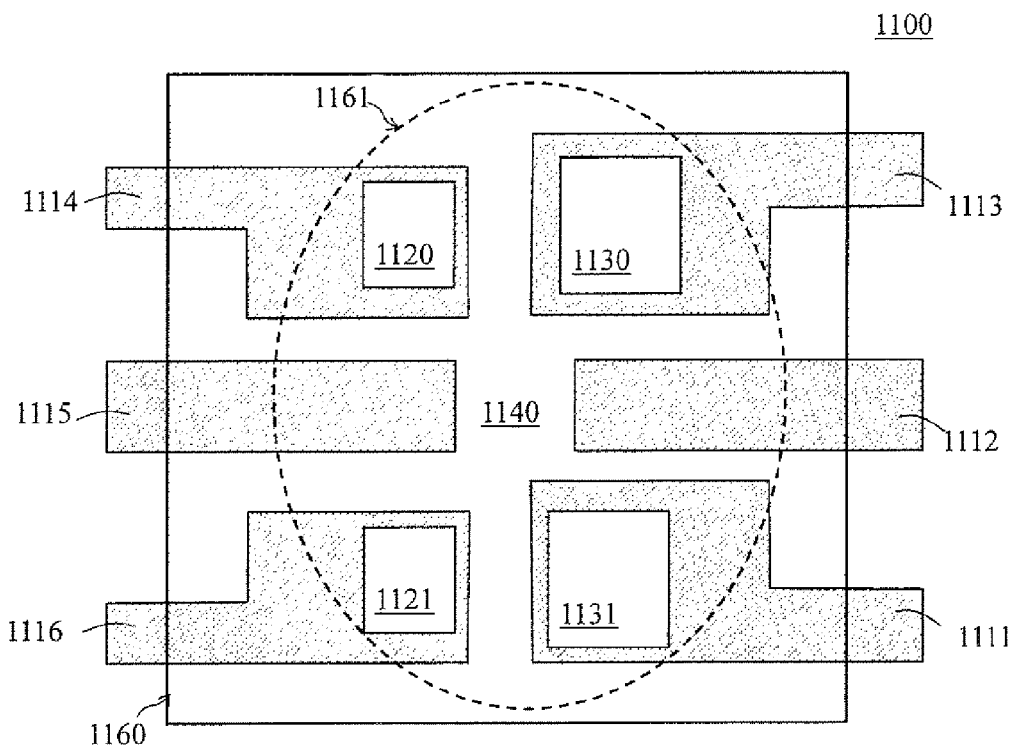
FIG. 11 illustrates a top view of a multichannel optocoupler with a light guide defining element having a single cavity.

In some situations, the optical transmitter 920-921 and receiver 930-931 dies may not be separated in different cavities 961-962 as shown in FIG. 9, because the signal from an optical transmitter die 920 may be received by any one of the two receiver dies 930-931. In such a situation, only one cavity 960 may be used. This situation is shown in the embodiment illustrated in FIG. 11. FIG. 11 illustrates a multichannel optocoupler 1100 without wire bonds and without the opaque encapsulant. The multichannel optocoupler 1100 comprises a plurality of conductors 1111-1116, optical transmitter dies 1120-1121, optical receiver 1130-1131 dies, a light guide defining element 1160, and a light guide 1140. All the optical transmitter dies 1120-1121 and receiver 1130-1131 dies may be encapsulated within the light guide 1140 in a single cavity 1161, as shown in FIG. 11.

Figure 12:
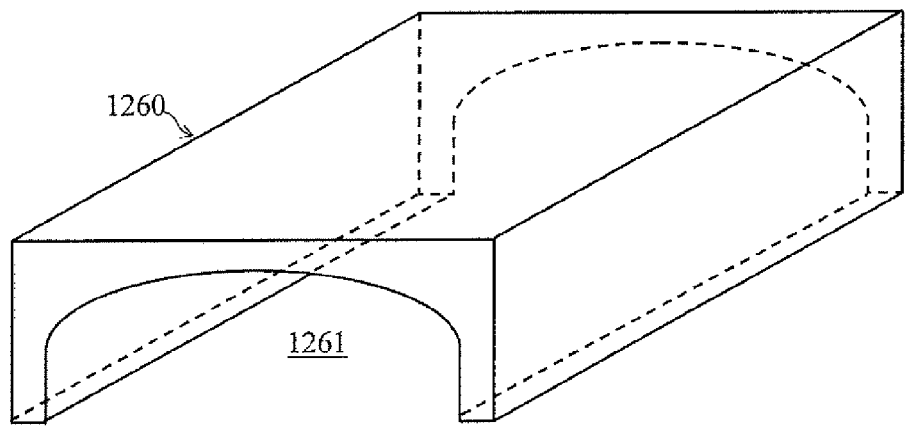
FIG. 12 illustrates a perspective view of a light guide defining element having a channel adapted to be cascaded to another light guide defining element of an adjacent optocoupler.

In the case in which the optocoupler 1100 may be coupled to a neighboring optocoupler 1100, so that signals may be transmitted from any of the optical transmitter dies 1120-1121 to any of the optical receiver dies 1130-1131 of a neighboring optocoupler 1100, the light guide defining element 1100 may not define a dome shape as in FIG. 11. In such a situation, the light guide defining element 1260 may define a channel 1261 that may be open ended at both ends of the longitude axis, as shown in FIG. 12. By co-axially aligning the channels 1261 of two adjacent optocouplers (not shown), optical communication between the two different optocouplers may be achieved.

Figure 13:
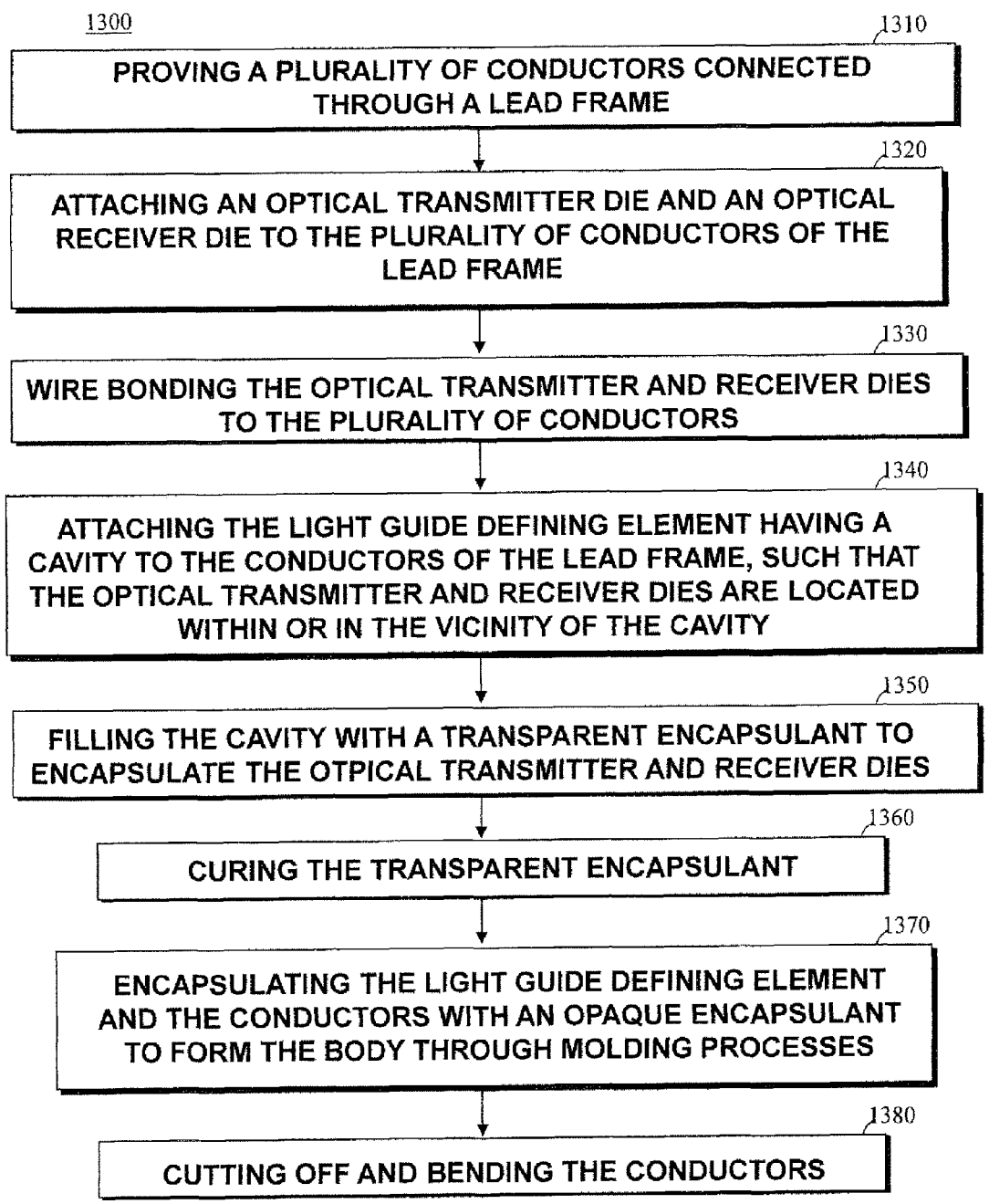
FIG. 13 illustrates a method for manufacturing an optocoupler with a light guide defining means.

FIG. 13 is a flow chart 1300 illustrating a possible manufacturing process of the optocoupler 400, described in FIG. 4. In step 1310, a plurality of conductors is provided. The plurality of conductors may be in a form of leads of a lead frame. In step 1320, an optical transmitter die and an optical receiver die may be attached to one or more of the conductors of the lead frame. For example, an epoxy material for die attach may be applied to the back surface of the dies, followed by attaching the die to a suitable portion of the lead frame. The method 1300 may then proceed to step 1330, in which the optical transmitter and receiver dies are wire bonded to the respective conductors of the lead frame, such that electrical connection may be established. For example, the optical transmitter die may be connected to a first power supply, whereas the optical receiver die may be connected to a second power supply that is isolated from the first power supply.

The method 1300 may next proceed to step 1340, in which a light guide defining element may be attached to the conductors of the lead frame or the PCB substrate, such that the optical transmitter and receiver dies are located within or in the vicinity of the cavity of the light guide defining element. In step 1350, a transparent encapsulant in liquid form is injected into the cavity of the light guide defining element to encapsulate the optical transmitter and receiver dies. The transparent encapsulant may also encapsulate and protect all the bond wires bonding the dies to the conductors.

The method 1300 may next proceed to step 1360, in which the transparent encapsulant may be cured into a solid to form a light guide, Optionally, before step 1360, an adhesive tape can be applied to the side of lead frame opposite the light guide defining element so that the light guide is surrounded by the light guide defining element and the tape.

The method 1300 may next proceed to step 1370, which starts with a first molding process to form the lower portion of the body to encapsulate a portion of the conductors. This may be followed by another molding process to form the upper portion of the body encapsulating the light guide defining element, the conductors and subsequently all the dies. The upper and lower portions of the body may be formed in the other order, with the upper portion formed first and the lower portion formed second. Finally, method 1300 may proceed to step 1380, in which the conductors may be cut from the lead frame and bent into leads of a specific package.

Referring to FIG. 4, the size and shape of the light guide 440 may depend on the viscosity of the material used to fabricate the light guide 440. However, limiting the liquid-form encapsulant to only the upper portion 471 may yield consistent light guide 440 in terms of size and shape. By limiting the light guide 440 to only the upper portion 471 of the body 470, the amount of encapsulant needed to produce the light guide 440 is reduced. The volume of the light guide 440 is also reduced substantially. This may yield a consistent light guide 440 even without using the light guide defining element 460. In addition, limiting the light guide 440 only to the upper portion 441 has other advantages. For example, the height of the optocoupler 400 may decrease. Another advantage is that the reliability performance may improve. When the overall size of the light guide 440 is reduced substantially, the interlocking mechanism between the body 470 and the light guide 440 increases. One way to confine the light guide 440 to the upper portion 471 is by means of a tape 590 shown in FIG. 5. However, there are other means to confine the light guide 440 to the upper portion 471 of the body 470 as shown in various embodiments disclosed hereinafter.

Figure 14:
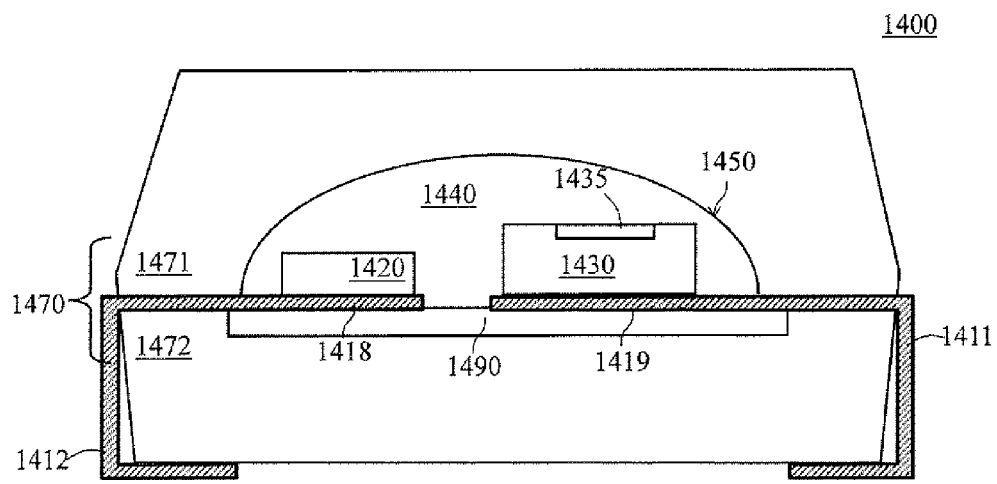
FIG. 14 illustrates a cross-sectional view of an optocoupler with a limiting element glued a lead frame package with the optical transmitter and receiver dies located at different lead of a lead frame.

FIG. 14 shows an embodiment of an optocoupler 1400 substantially similar to the optocoupler 400, but differs at least in that the optocoupler 1400 is without the light guide defining element 460 but having a limiting element 1490 to confine the light guide 440 to the upper portion 471 of the body 470 shown in FIG. 4. The optocoupler 1400 comprises a plurality of conductors 1411-1412, an optical transmitter die 1420, an optical receiver die 1430 having at least one photo-detector 1435, a light guide 1440, a limiting element 1490 and a body 1470 having an upper 1471 portion and a lower portion 1472. In the embodiment shown in FIG. 14, two of the conductors 1411-1412 may extend to define conductive pads 1418-1419 adapted to receive the optical transmitter 1420 and receiver 1430 dies. However, in yet another embodiment, only one of the conductors 1411-1412 may extend to define a conductive pad 1418 to receive both the optical transmitter 1420 and receiver 1430 dies.

The limiting element 1490 is configured to ensure the light guide 1440 to be limited to the upper portion 1471 of the body 1470. Compared to the light guide 1440 shown in FIG. 4, the light transmission efficiency of the light guide 1440 increases because the light loss due to the lower portion 442 of the light guide 440 shown in FIG. 4 is substantially eliminated. In addition, the light guide 1440 may further comprise a reflective surface 1450 to prevent light loss.

The limiting element 1490 may be a dielectric tape made from Mylar, Polyimide, Melinex, or any other similar material similar to the tape 590 shown in FIG. 5. The limiting element 1490 may be glued to the conductors 1411-4412. Alternatively, the limiting element 1490 may be a pre-molded flat surface plastic attached to the plurality of conductors 1411-1412 by using an epoxy material or glue. For example, the light guide 1440 may be dispensed on the limiting element 1490 in liquid encapsulant to encapsulate the optical transmitter 1420 and receiver 1430 dies before being cured into solid form. As a result, the conductive pads 1418 and 1419 adapted to hold the optical transmitter 1420 and receiver 1430 dies are sandwiched between the dies 1420-1430, and the liming element 1490 respectively. The size of the limiting element 1490 is usually larger than the light guide 1440. In some occasion, the limiting element 1490 may be at least 50% larger than the light guide 1440.

Figure 15:
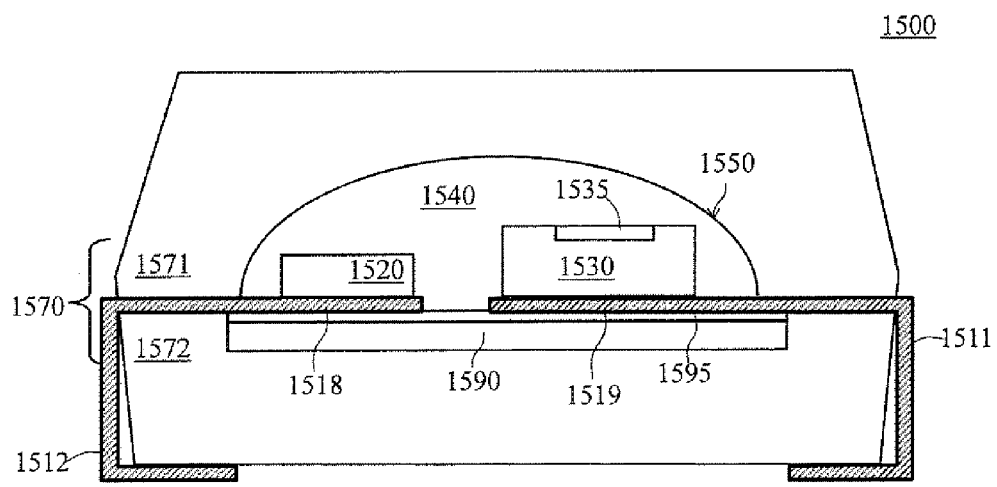
FIG. 15 illustrates a cross-sectional view of an optocoupler with a limiting element attached to a lead frame package using epoxy with the optical transmitter and receiver dies located at different conductors of a lead frame.

FIG. 15 shows an embodiment of an optocoupler 1500 comprising a plurality of conductors 1511-1512, an optical transmitter die 1520, an optical receiver die 1530 having at least one photo-detector 1535, a light guide 1540, a limiting element 1590 and a body 1570 having an upper 1571 portion and a lower portion 1572. The light guide 1540 may comprise a reflective surface 1550. The optical transmitter 1520 and receiver 1530 dies are attached to conductive pads 1518-1519. The optocoupler 1500 differs from the optocoupler 1400 at least in that the limiting element 1590 is attached to the plurality of conductors 1511-1512 through a layer of epoxy 1595. Examples of the epoxy 1595 are F202 epoxy from Tracon, OP-4-20632 epoxy from Dymax or any other similar type of epoxy. The limiting element 1590 may be a dielectric tape similar to the limiting element 1490 of the optocoupler 1400, or a polymer film, a molded plastic film or any other material.

Figure 16A:
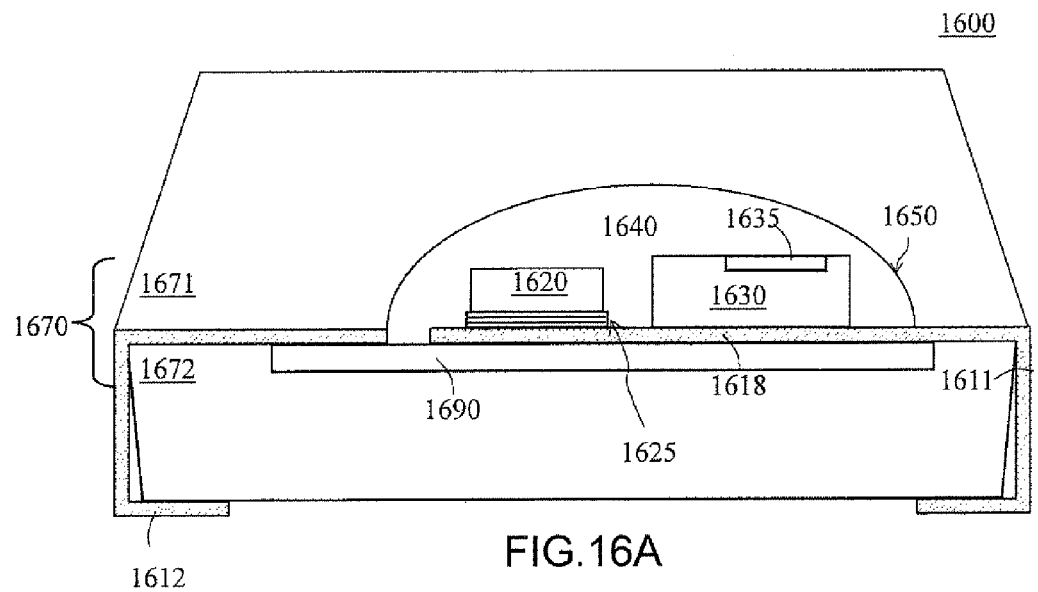
FIG. 16A illustrates a cross-sectional view of an optocoupler with a limiting element glued a lead frame package with the optical transmitter and receiver dies located on one conductive pad.
Figure 16B:
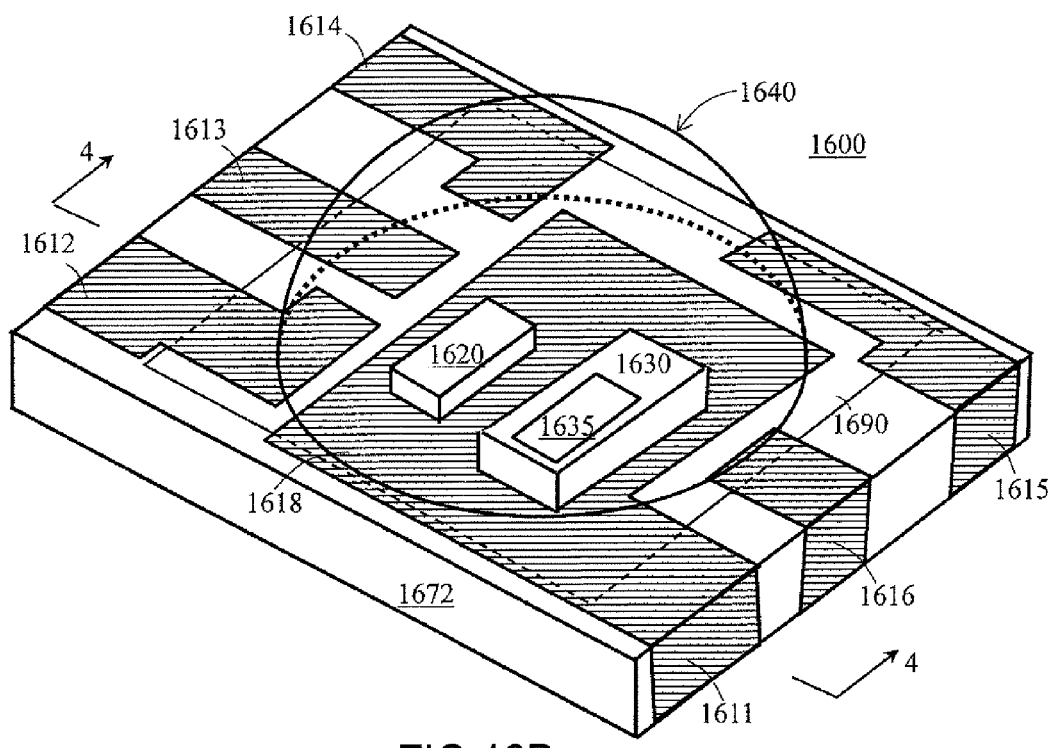
FIG. 16B illustrates a perspective view of a partially completed optocoupler shown in FIG. 16A without wire bonds and without an opaque encapsulant.

FIG. 16A-16B shows an embodiment of an optocoupler 1600 comprising a plurality of conductors 1611-1616, an optical transmitter die 1620, an optical receiver die 1630 having at least one photo-detector 1635, a light guide 1640 having a reflective surface 1650, a limiting element 1690 and a body 1670 having an upper portion 1671 and a lower portion 1672. FIG. 16B shows a perspective view of the optocoupler 1600 but without the wire bond and without the upper portion 1671 of the body 1670. FIG. 16A is a cross sectional view of the optocoupler 1600 taken along line 4-4 shown in FIG. 16B, One of the conductors 1611 may extend and define a conductive pad 1618 configured to receive both the optical transmitter 1620 and receiver 1630 dies. The conductive pad 1618 may be sandwiched between the limiting element 1690 and the both the optical transmitter 1620 and receiver 1630 dies, or alternatively in another embodiment, the conductive pad 1618 may be sandwiched between the limiting element 1690 and one of the dies 1620 or 1630. As shown in FIGS. 16A and 16B, both the optical transmitter 1620 and receiver 1630 dies are attached to the common conductive pad 1618 but in a different manner. The optical transmitter die 1620 is attached to the common conductive pad 1618 via three layers of materials 1625, comprising an isolation layer sandwiched between two securing layers. The optical receiver die 1630 is attached directly to the conductive pad 1618. However, this arrangement may be interchangeable in yet another embodiment.

Having the optical transmitter 1620 and receiver 1630 dies attached to the common pad 1618 enables the optical transmitter die 1620 to be placed nearer to the optical receiver die 630. As a result, the light guide 1640 of the optocoupler 1600 may be smaller compared to the optocouplers 1400 and 1500 shown in FIGS. 14 and 15. A smaller light guide 1640 may enable consistent size and shape in mass production. In addition, the shorter distance may also yield higher light transmission efficiency of the light guide 1640.

As shown in FIG. 16B, in order to accommodate the entire light guide 1640, the limiting element 1690 may be larger than the light guide 1640. In yet another embodiment, the limiting element 1690 may be larger than the light guide 1640. For reliability consideration to ensure interlocking between the limiting element 1690 and the body 1670, the limiting element 1690 is usually encapsulated within the body 1670. Thus, the limiting element 1690 is usually smaller than the body 1670.

Figure 17:
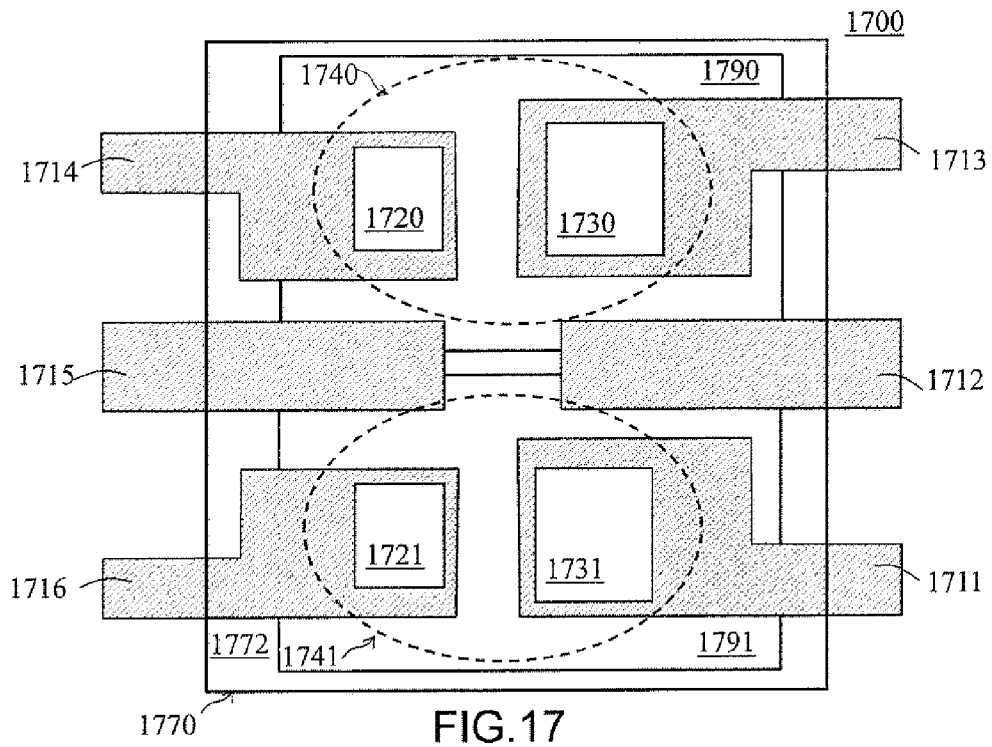
FIG. 17 illustrates a top view of a multichannel optocoupler having two cavities using two limiting elements.

FIG. 17 is an embodiment showing a top view of a multichannel optocoupler 1700 without wire bond and without the upper portion of the body. The optocoupler 1700 comprises a plurality of conductors 1711-1716, a plurality of optical transmitter dies 1720-1721, a plurality of optical receiver dies 1730-1731, a plurality limiting elements 1790-1791, a plurality of light guide 1740-1741, and a body 1770 having an upper portion (not shown) and a lower portion 1772. Each of the limiting elements 1790-1791 may be configured to accommodate each of the light guides 1740-1741 respectively. In yet another embodiment, the optocoupler 1700 may comprise a single limiting element 1790 configured to accommodate both light guides 1740-1741.

Figure 18A:
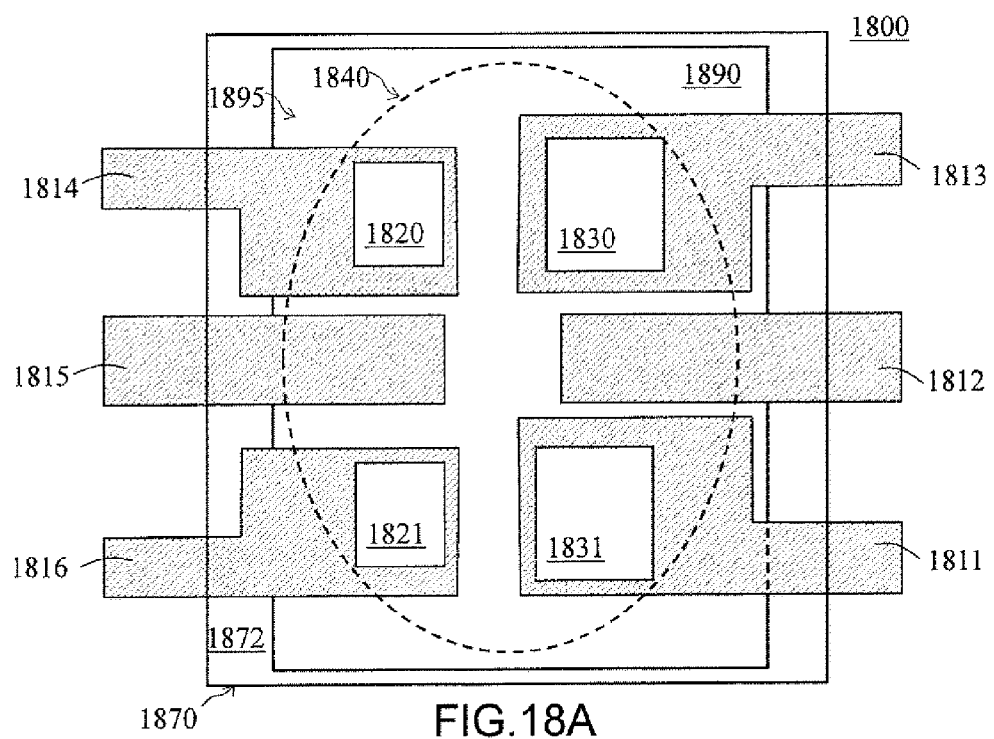
FIG. 18A illustrates a top view of a multichannel optocoupler having single cavity without wire bonds and without an opaque encapsulant.

FIG. 18A is an embodiment showing a top view of a multichannel optocoupler 1800 without wire bond and without the upper portion of the body 1870. The optocoupler 1800 comprises a plurality of conductors 1811-1816, a plurality of optical transmitter dies 1820-1821, a plurality of optical receiver dies 1830-1831, a limiting element 1890, a light guide 1840, and a body 1870 having an upper portion (not shown) and a lower portion 1872. All the optical transmitter 1820-1821 and receiver 1830-1831 dies are encapsulated within a single common light guide 1840. The light guide 1840 is formed on one limiting element 1890. As a single light guide 1840 is used, light from any of the optical transmitter dies 1820-1821 may be received by any of the optical receiver dies 1830-1831.

Figure 18B:
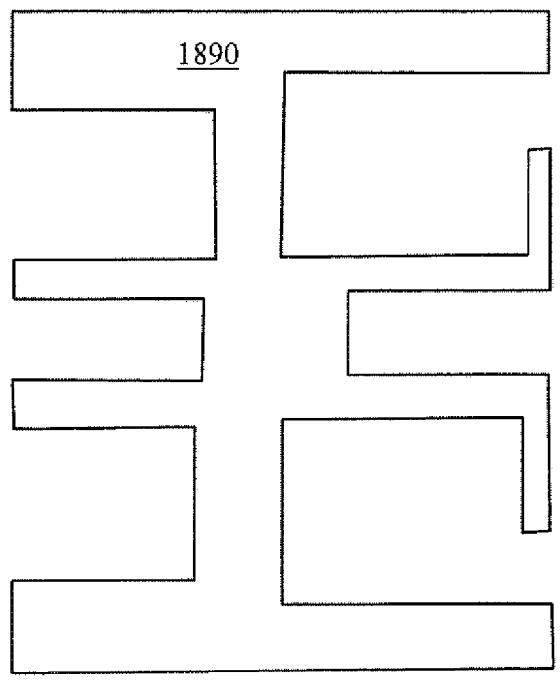
FIG. 18B illustrates a limiting element having an inconsistent shape.
Figure 18C:
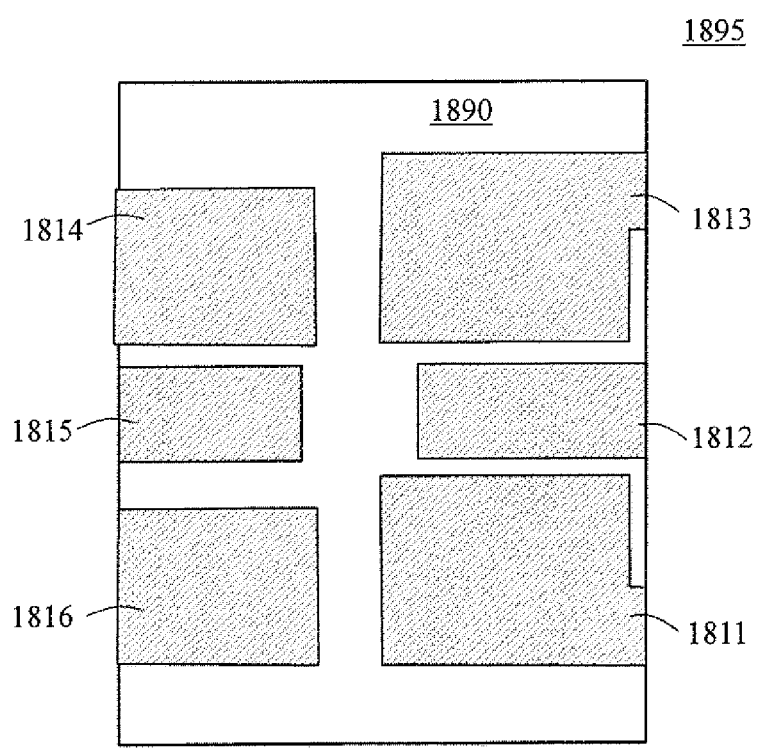
FIG. 18C illustrates a surface for receiving the light guide comprising the limiting element and a portion of the plurality of conductors.

Although usually the limiting element 1890 is a thin flat rectangular object, the limiting element 1890 may define any shape, including any inconsistent shape. For example, the limiting element 1890 has a shape as shown in FIG. 18B, which defines an inconsistent shape unable to accommodate the light guide 1840. Coupling with the conductors 1811-1816, the limiting element 1890 defines a flat surface 1895 as shown in FIG. 18C after being attached to the conductors 1811-1816. The flat surface 1895 is configurable to accommodate the light guide 1840 on the upper portion 1871 of the body 1870.

The optocouplers 1400, 1500, 1600 1700 and 1800 may be manufactured using the method shown in FIG. 13 with optional step of attaching the limiting element 1490, 1590, 1690, 1790 and 1890 either before step 1320 or after step 1330.

Although specific embodiments of the invention have been described and illustrated, the invention is not to be limited to the specific forms or arrangements of parts so described and illustrated. It is to be understood that the illustration and description shall not be interpreted narrowly. For example, the optical transmitter die 220 may be an LED, but may also be a die with an integrated LED and circuitry or a light source using future technologies. Similarly, although optocoupler is illustrated in all embodiments, it is understood by the person having ordinary skill in the art that the invention may be applicable to the packaging of any other optical devices having at least an optical transmitter die and an optical receiver die encapsulated in a common light guide. The scope of the invention is to be defined by the claims appended hereto and their equivalents.

What is claimed is:

1. A packaging for an opto-electronic device, comprising:
   a body;
   a first optical transmitter die configured to emit light;
   a first optical receiver die configured to receive a portion of the light emitted by the first optical transmitter die;
   a conductive pad, the conductive pad having a component side and an opposing side that opposes the component side with at least one of the first optical transmitter and receiver dies being mounted on the component side of the conductive pad;
   a first light guide configured to transmit light adjacent to the component side of the conductive pad, from the first optical transmitter die to the first optical receiver die;
   a limiting element configured to confine the first light guide to the component side of the conductive pad when the first light guide is in liquid form prior to being hardened into solid form so as to substantially eliminate light transmission along the opposite side of the conductive pad;
   an attachment layer sandwiched between the opposing side of the conductive pad and the limiting element; and
   an opaque encapsulant encapsulating the first light guide and the limiting element forming the body.

2. The packaging of claim 1, wherein the limiting element is a thin flat dielectric tape.

3. The packaging of claim 1, wherein the limiting element is substantially reflective.

4. The packaging of claim 1, wherein the limiting element is at least 50% larger than the first light guide.

5. The packaging of claim 1, wherein the limiting element couples with the conductive pad to provide a surface for receiving the first light guide.

6. The packaging of claim 1, wherein one of the first optical transmitter and receiver dies is attached directly to the conductive pad, the other one of the first optical transmitter and receiver dies is attached to the conductive pad via three layers of materials comprising an isolation layer sandwiched between two securing layers.

7. The packaging of claim 1, comprises a second optical transmitter die and a second optical receiver die located adjacent to the component side of the conductive pad.

8. The packaging of claim 7, wherein the second optical transmitter and receiver dies are encapsulated within the first light guide.

9. The packaging of claim 7 further comprises a second light guide encapsulating the second optical transmitter and receiver dies, wherein the second light guide is formed from liquid form before being hardened into solid form, and the second light guide is confined to the component side of the conductive pad by the limiting element.

10. The packaging of claim 9, wherein the first and second light guides are optically isolated.

11. The packaging of claim 7 further comprises a second light guide formed from liquid form encapsulating the second transmitter and receiver dies, and a second limiting element configured to confine to the second light guide to the component side of the conductive pad.

12. The packaging of claim 1, wherein the first optical transmitter die is attached to the conductive pad and the first optical receiver die is attached to an additional conductive pad.

13. The packaging of claim 1, wherein the packaging forms a portion of an optocoupler.

14. The packaging of claim 1, wherein the limiting element is made from one of the Mylar, Polyimide and Melinex material.

15. An optocoupler comprising:
a body;
a first optical transmitter die configured to emit light;
a first optical receiver die configured to receive light emitted by the first optical transmitter die;
an attachment layer;
a plurality of conductive leads, wherein at least one of the conductive leads forms a conductive pad to receive at least one of the first optical transmitter and receiver dies;
a component side of the conductive pad configured to receive at least one of the first optical transmitter and receiver die;
an opposing side of the conductive pad opposing the component side configured to receive the attachment layer;
a tape attached to the opposing side of the conductive pad through the attachment layer such that the attachment layer is sandwiched between the tape and the conductive pad;
a light guide encapsulating the first optical transmitter and receiver dies on the tape, wherein the tape is configured to confine the light guide when the light guide is in liquid form prior to being hardened into solid form so that the light guide is configured to transmit light adjacent to the component side of the conductive pad and substantially eliminate light transmission along the opposite side of the conductive pad; and
an opaque encapsulant encapsulating the light guide and the tape forming the body.

16. The optocoupler of claim 15, wherein tape is a thin flat dielectric film.

17. The optocoupler of claim 15, wherein the tape is substantially reflective.

18. The optocoupler of claim 15, wherein one of the first optical transmitter die and receiver die is attached directly to the conductive pad, the other one of the first optical transmitter die and the first optical receiver die is attached to the conductive pad via three layers of materials comprising an isolation layer sandwiched between two securing layers.

19. The optocoupler of claim 15, wherein the tape is made from one of the Mylar, Polyimide and Melinex material.

20. An opto-electronic device, comprising:
a body having an upper portion and a lower portion;
an optical transmitter die configured to emit light;
an optical receiver die configured to receive light emitted by the optical transmitter die;
a plurality of conductive leads, wherein the optical transmitter and receiver dies are mounted on at least one of the conductive leads interposed between the upper and lower portion of the body;
a light guide encapsulating the optical transmitter die and receiver dies configured to transfer light from the optical transmitter die to the optical receiver die located on the upper portion of the body;
a thin dielectric tape attached to the at least one of the conductive leads, the thin dielectric tape being configured to confine the light guide to the upper portion of the body when the light guide is in liquid form before being hardened into solid form, so as light transmission is confined to the upper portion of the body; and
an attachment layer sandwiched between the at least one of the conductive leads and the dielectric tape.

* * * * *